United States Patent
Liu et al.

(10) Patent No.: US 6,239,026 B1
(45) Date of Patent: May 29, 2001

(54) NITRIDE ETCH STOP FOR POISONED UNLANDED VIAS

(75) Inventors: Qizhi Liu, Santa Ana; David Feiler, Sherman Oaks, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/162,185

(22) Filed: Sep. 28, 1998

(51) Int. Cl.$^7$ ................................................ H01L 21/4763
(52) U.S. Cl. ........................... 438/637; 438/734; 438/740
(58) Field of Search .................................. 438/724, 723, 438/740, 633, 719, 743, 744, 763, 622, 624, 634, 637, 702, 734, 737, 738, 618

(56) References Cited

U.S. PATENT DOCUMENTS

| | | | |
|---|---|---|---|
| 4,560,436 | 12/1985 | Bukhman et al. . | |
| 5,451,543 | 9/1995 | Woo et al. | 437/195 |
| 5,496,776 | 3/1996 | Chien et al. | 437/231 |
| 5,536,683 | 7/1996 | Lin et al. | 437/200 |
| 5,545,581 | 8/1996 | Armacost et al. | 438/631 |
| 5,593,919 | 1/1997 | Lee et al. | 437/190 |
| 5,646,440 | 7/1997 | Hasegawa | 257/635 |
| 5,651,856 | 7/1997 | Keller et al. . | |
| 5,702,981 | 12/1997 | Maniar et al. | 437/192 |
| 5,726,100 * | 3/1998 | Givens | 438/702 |
| 5,741,626 * | 4/1998 | Jain | 430/314 |
| 5,757,077 | 5/1998 | Chung et al. | 257/736 |
| 5,759,906 | 6/1998 | Lou | 438/623 |
| 5,795,823 * | 8/1998 | Avanzino | 438/639 |
| 5,880,018 * | 3/1999 | Boeck | 438/619 |
| 5,882,996 * | 3/1999 | Dai | 438/597 |
| 5,920,790 * | 7/1999 | Wetzel | 438/618 |
| 5,935,868 * | 8/1999 | Fang | 438/692 |
| 5,981,379 * | 11/1999 | Tsai | 438/638 |
| 6,020,258 * | 2/2000 | Yew | 438/634 |
| 6,054,398 * | 4/2000 | Pramanick | 438/784 |
| 6,063,711 * | 5/2000 | Chao | 438/724 |
| 6,071,809 * | 6/2000 | Zhao | 438/634 |
| 6,080,655 * | 6/2000 | Givens | 438/626 |
| 6,083,822 * | 7/2000 | Lee | 438/624 |
| 6,100,184 * | 8/2000 | Zhao | 438/638 |
| 6,103,616 * | 8/2000 | Yu | 438/622 |
| 6,110,826 * | 8/2000 | Lou | 438/674 |

FOREIGN PATENT DOCUMENTS

| | | |
|---|---|---|
| 0 559 323 A2 | 9/1993 | (EP) . |
| 0 568 385 A2 | 11/1993 | (EP) . |
| 0706215 | 4/1995 | (EP) . |
| 0 660 392 A1 | 6/1995 | (EP) . |
| 0822586 | 2/1998 | (EP) . |

* cited by examiner

Primary Examiner—Stephen D. Meier
Assistant Examiner—David Goodwin
(74) Attorney, Agent, or Firm—Snell & Wilmer, LLP

(57) ABSTRACT

The present invention relates to the reduction of poisoned vias in a submicron process technology semiconductor wafer by reducing the occurrence of over-etched vias through the inclusion of an etch-stop layer. Vias are created to connect conductive portions of a semiconductor wafer and if the vias are over-etched, the connection may be poor. In order to prevent the over-etching of vias, a three-step etch process is completed on a semiconductor wafer having an insulating layer, an etch-stop layer, a low dielectric constant layer, a conductive layer and a foundation layer. A via is first non-selectively etched such that the etch terminates within the insulating layer. The via is subsequently selectively etched such that the etch terminates at the etch-stop layer. Lastly, the via is again non-selectively etched through the etch-stop layer and the low dielectric constant layer such that the etch terminates at the conductive layer.

9 Claims, 6 Drawing Sheets

NITRIDE ETCH STOP FOR POISONED UNLANDED VIAS

TECHNICAL FIELD OF THE INVENTION

The present invention relates generally to methods for forming interconnect structures within integrated circuit devices. More particularly, the present invention relates to the reduction of poisoned vias in a submicron integrated circuit device by reducing the occurrence of over-etched vias through the inclusion of a nitride etch-stop layer.

BACKGROUND OF THE INVENTION

Many advancements in the semiconductor fabrication industry have enabled the production of smaller, faster, and more efficient integrated circuit devices. However, the reduction in integrated circuit device dimensions may be limited by various process parameters. For example, in 0.25 $\mu$pm and smaller process technology using low dielectric constant insulating material between metal conductors, circuit devices often fail as a result of high via resistance caused by poisoned, unlanded vias.

FIG. 1 illustrates the cross section of a portion of a semiconductor wafer 8 fabricated in accordance with techniques commonly used in the industry. Wafer 8 of FIG. 1 includes a substrate layer 10 which is typically formed from silicon. An insulating layer 20 may be formed directly above substrate layer 10. Conductive material 30 may be deposited onto insulating layer 20 and suitably etched into conductive lines or portions. A layer 40 of material having a low dielectric constant, i.e., a "low-k" material, is spun onto conductive layer 30 such that low-k layer 40 fills in gaps 41 located in between the conductive lines of conductive layer 30, thus insulating the lines of conductive layer 30 from neighboring lines. After low-k layer 40 is cured, insulating layer 50 is then deposited on top of low-k layer 40. Insulating layer 50 then undergoes chemical mechanical planarization ("CMP") to smooth out insulating layer 50. CMP processes are well known in the industry and inherently produce wide-ranging thicknesses of insulating layer 50. The thickness of insulating layer 50 varies between wafers as well as within each wafer.

To create interconnects between conductive portions of wafer 8, vias or holes 60 (FIG. 1 showing one via) are etched through insulating layer 50 and low-k layer 40 to conductive layer 30. Via 60 is targeted for the center of a conductive line of conductive layer 30, but some tolerance is permitted for misalignment. A via that lands directly on a conductive line is called a landed via. A via that lands partly on a conductive line and partly off the conductive line is called an unlanded via. A conductive filler material such as tungsten may be deposited into via 60 to connect the conductive line of conductive layer 30 with another conductive element (not shown) formed above insulating layer 50.

Because of the varying thickness of insulating layer 50 resulting from the CMP process, the depth of the etch required to reach the top of conductive layer 30 is uncertain. In the event of an over-etch, i.e., an etch that goes too deep into low-k layer 40, an unlanded via may develop into a poisoned via 62 (as shown in FIG. 2). More specifically, the additional etching causes via 62 to penetrate into low-k layer 40 beyond the upper surface of conductive layer 30. This results in an increase in the surface area of via 62 defined by low-k layer 40.

Low-k layer 40 absorbs moisture which will outgas into via 62 during the deposition of the filler material. This moisture will react with the filler material and prevent the optimized formation of the filler material inside via 62. The amount of moisture being outgassed is directly proportional to the amount of surface area of low-k layer 40 forming via 62. Thus, in the case of an over-etch of an unlanded via, a much larger surface area of low-k layer 40 forms via 62, as compared to the case of an optimally etched landed via 60 as shown in FIG. 1, which increases the chances that the filler material will not properly form inside the via. The resulting connection between conductive layer 30 and the filler material will not be optimal and will exhibit a high via resistance.

If one via is poisoned the entire integrated circuit device may fail. Currently, the yield of 0.25 $\mu$m integrated circuit devices is low because of failures resulting from unlanded poisoned vias.

Previous attempts have been made to solve the problems of unlanded poisoned vias with the implantation of arsenic ions. After a low-k layer has been spun onto a wafer, arsenic ions are implanted into the low-k layer so that the low-k layer will not absorb moisture. This procedure prevents outgassing from occurring, enabling the filler material to properly fill inside the vias. However, there are several problems with this procedure. First, the implantation of the arsenic ions raises the dielectric constant of the low-k layer. In addition, the implantation requires the use of arsenic, a poisonous element, which causes many health-related problems. Moreover, the process requires an additional step of implanting the arsenic ions which greatly increases manufacturing costs.

In addition, a possible solution might be to measure each semiconductor wafer after the CMP process to determine the thickness of each wafer, and thus determine the depth of the etch that would be required to create the via. However, this process would be extremely costly in that it would be time consuming and labor intensive, resulting in a slow production line.

SUMMARY OF THE INVENTION

Accordingly, it is an advantage of the present invention to reduce the formation of poisoned vias on semiconductor wafers using submicron process technology by the addition of an etch-stop layer.

The above and other advantages are carried out in one form by a semiconductor device comprised of: a foundation layer, a conductive layer formed and etched above the foundation layer, a low dielectric constant layer which is formed above the conductive layer, an etch-stop layer which is formed above the low dielectric constant layer, an insulating layer which is formed above the etch-stop layer and at least one via etched through the insulating layer, the etch-stop layer and the low dielectric constant layer to the conductive layer. With respect to the conductive layer, the vias may be landed vias or unlanded vias, or a combination thereof.

The vias are preferably etched in a three-step process. The three-step etch process may include a first non-selective etch which may go through at least some portion of the insulating layer, a second selective etch which may go through some additional portion of the insulating layer, and a third non-selective etch which may go through the etch-stop layer and the low dielectric constant layer and which stops at the conductive layer.

BRIEF DESCRIPTION OF THE DRAWING

A more complete understanding of the present invention may be derived by referring to the detailed description and claims when considered in connection with the Figures, wherein like reference numbers refer to like items throughout the Figures, and:

DETAILED DESCRIPTION OF THE PREFERRED EMBODIMENTS

Figure 3:
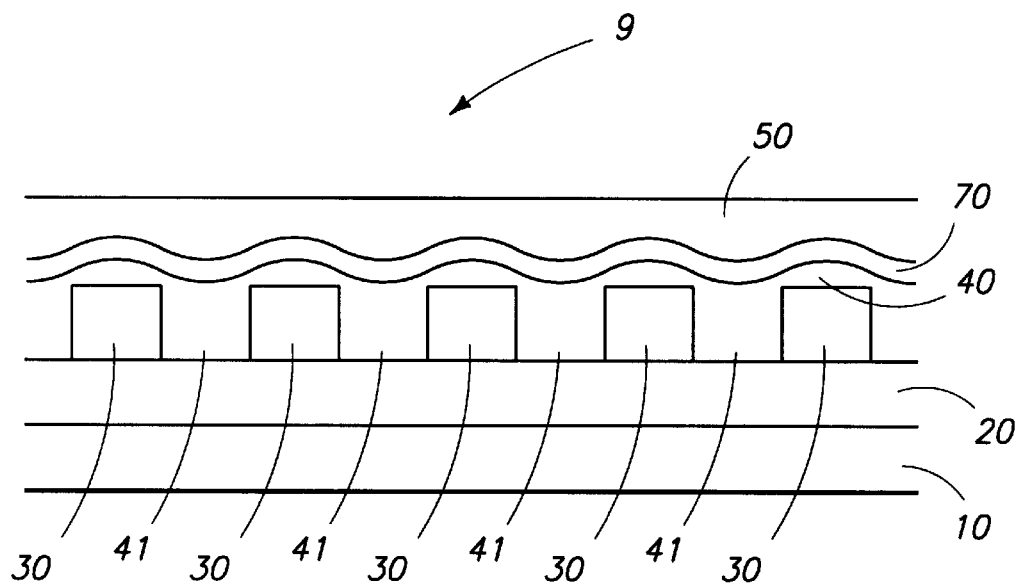
FIG. 3 shows a cross section of a portion of a semiconductor wafer of one embodiment of the present invention.

Referring to FIG. 3, an exemplary semiconductor wafer 9 includes a foundation of a substrate layer 10 and an insulating layer 20 formed on a top side of substrate layer 10. As one skilled in the art will appreciate, many different types of foundations and foundation materials are known and could be used. The foundation may be a single layer or, as shown, multiple layers of materials. More specifically, substrate layer 10 could represent one or more materials, such as silicon or gallium arsenide, and insulating layer 20 could represent one or more materials that have been grown or deposited above substrate layer 10 such as polysilicon, undoped silicate glass ("USG"), or silicon dioxide, which has a dielectric constant, k, of 4.0. A conductive layer 30 is deposited onto insulating layer 20. Conductive layer 30 is then patterned and etched into a plurality of conductive portions that vary greatly in length. These conductive portions could be conductive plates that are, for example, approximately 100 $\mu$m wide, or conductive lines that are, for example, approximately 1 $\mu$m wide. Conductive layer 30 is typically made of aluminum, an aluminum copper alloy or an aluminum silicon alloy.

Figure 4:
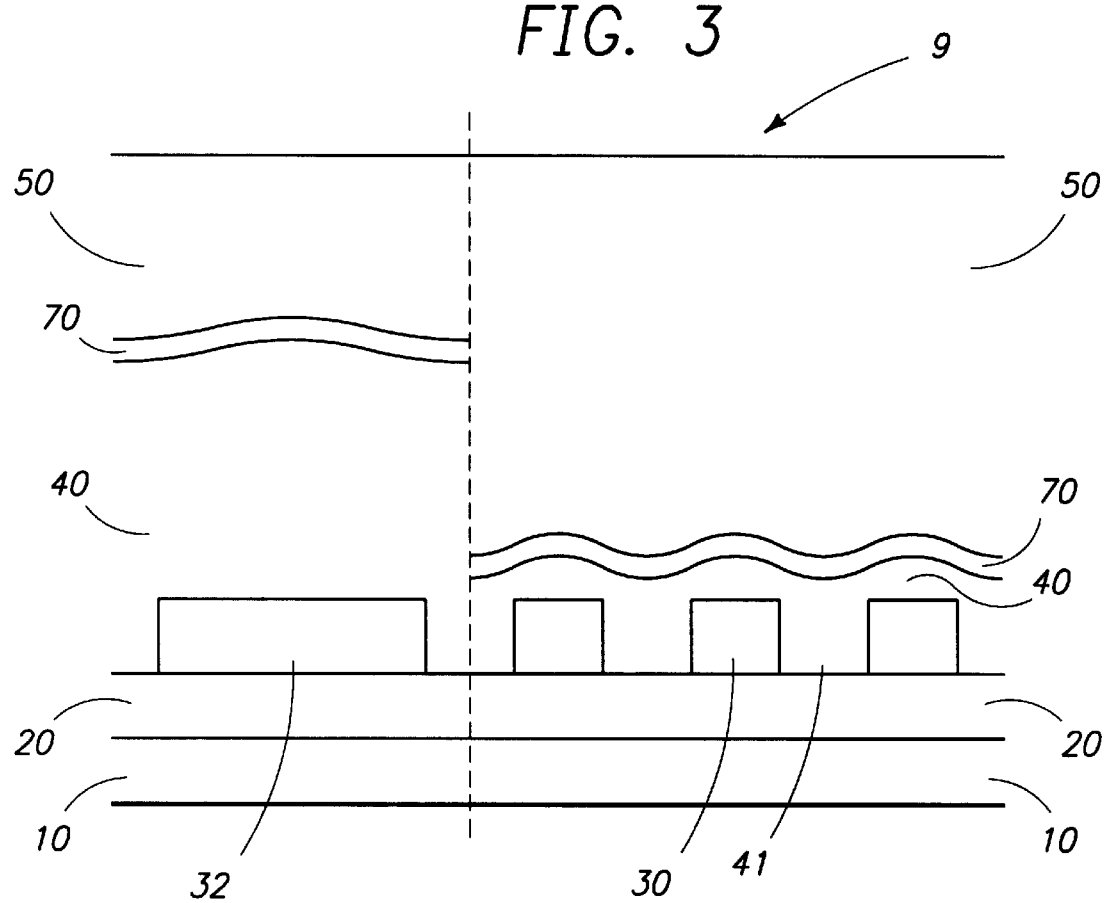
FIG. 4 shows a cross section of a portion of a semiconductor wafer having a conductive layer composed of a conductive plate and conductive lines.

A material having a low dielectric constant, i.e., a "low-k" material, is grown, deposited, or spun onto conductive layer 30 to form a low-k layer 40. Low-k layer 40 fills in gaps 41 located in between conductive layer 30, thus insulating the conductive lines or conductive plates of conductive layer 30 from neighboring conductive lines or conductive plates. The thickness of low-k layer 40 may be greater over a conductive plate than over a conductive line, as shown in FIG. 4. Low-k layer 40 is typically a material having a dielectric constant that is less than 4.0, such as hydrogen silsesquioxane which has a dielectric constant of 2.8. Other low-k materials that are known in the art could also be used.

Referring back to FIG. 3, after low-k layer 40 is cured, a material which may be etched by certain etchants, but not by other etchants, is preferably deposited above low-k layer 40 in the form of an etch-stop layer 70. As discussed below, etch-stop layer 70 prevents vias from being over-etched. In a preferred embodiment of this invention, etch-stop layer 70 is approximately 30 nm to 50 nm thick and is preferably a nitride liner such as silicon nitride, although other thicknesses and/or liners could also be used. As one skilled in the art will appreciate, silicon nitride is a very common etch-stop material. In other words, in the presence of an appropriate etchant, oxides, such as insulating layer 50 as discussed below, will exhibit a high etch selectivity over etch-stop layer 70.

A second insulating layer 50 may be deposited above etch-stop layer 70. Insulating material 50 could be the same material as insulating material 20, e.g., silicon dioxide or undoped silicate glass ("USG"), although other similar insulating materials could also be used. Insulating layer 50 may undergo chemical mechanical planarization ("CMP") to smooth out insulating layer 50 as is well known in the industry. As stated above, the CMP process inherently produces wide-ranging thicknesses of insulating layer 50 which exists between wafers as well as within each wafer.

Referring now to FIG. 4, in one embodiment of the present invention, conductive layer 30 may be patterned and etched to include a plurality of conductive lines 30 and/or conductive plates 32. In order to form interconnects between conductive portions of semiconductor wafer 9, vias or holes are etched through the various layers to reach conductive layer 30. Because the CMP process yields a varying thickness of insulating layer 50, it is difficult to determine the required depth of an etch needed to form a via.

Figure 1:
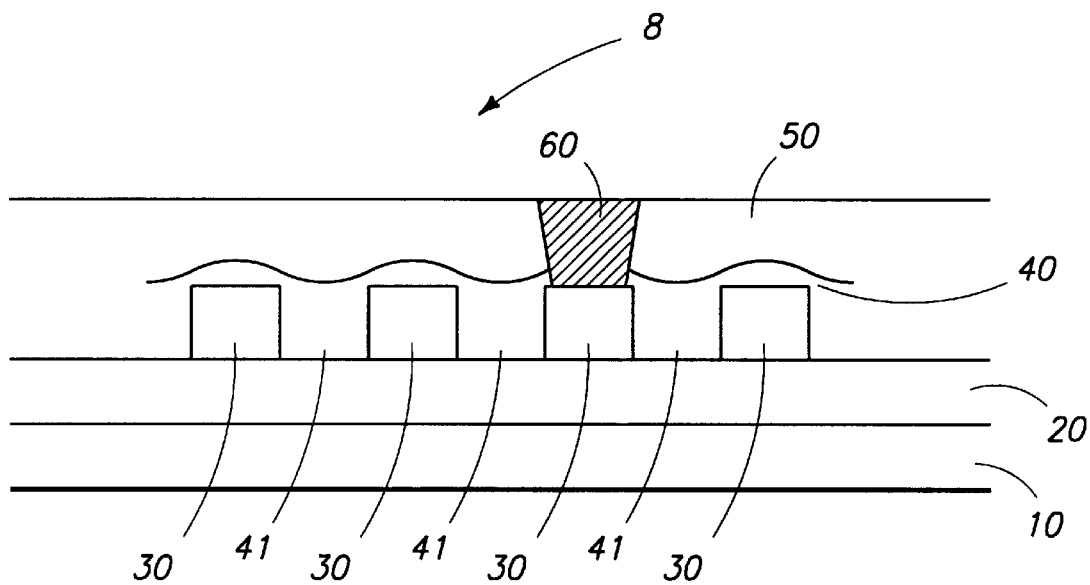
FIG. 1 shows a cross section of a portion of a prior art semiconductor wafer having a landed via.
Figure 2:
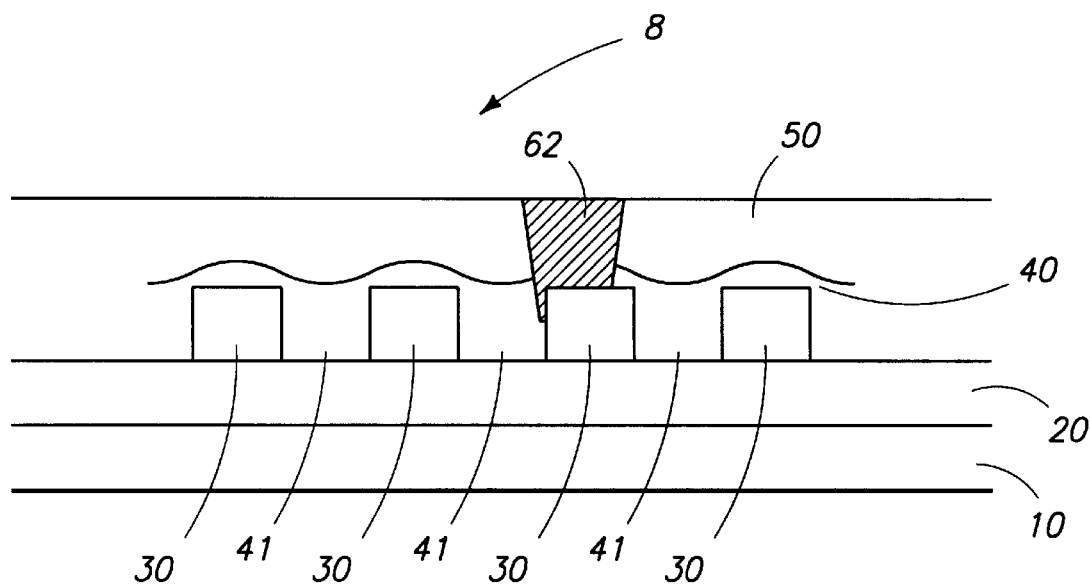
FIG. 2 shows a cross section of a portion of a prior art semiconductor wafer having an unlanded poisoned via.

With reference now to FIG. 1, assume, for example, 1,500 nm of insulating layer 50 is deposited above low-k layer 40 and, after CMP, the combined thicknesses of insulating layer 50 and low-k layer 40 ranges from 750 nm to 1,250 nm. If, as in the prior art, one etch was performed to create a via, in order to ensure that conductive layer 30 was reached, the etch would have to assume the greatest possible thickness, that being 1,250 nm, otherwise the possibility of a poor connection, such as an open circuit, exists. If an etch of this depth is performed, but in actuality the combined thicknesses of insulating layer 50 and low-k layer 40 is only 750 nm, an over-etch will occur and the possibility of a poisoned via forming is great.

In a preferred embodiment of this invention, etch-stop layer 70 may be added to ensure that vias are etched to a desirable depth, i.e., to the top of conductive layer 30. With reference again to FIG. 3, etch-stop layer 70 is deposited above low-k layer 40 and is composed of a material having a property that retards certain etchants from penetrating this layer. The addition of etch-stop layer 70, in combination with a multiple etch process, enables a via to be etched to a desirable depth regardless of the actual depth of insulating layer 50 as long as the range of possible thicknesses of insulating layer 50 can be obtained. Preferably, the approximate thicknesses of etch-stop layer 70 and low-k layer 40 can also be obtained.

Figure 5:
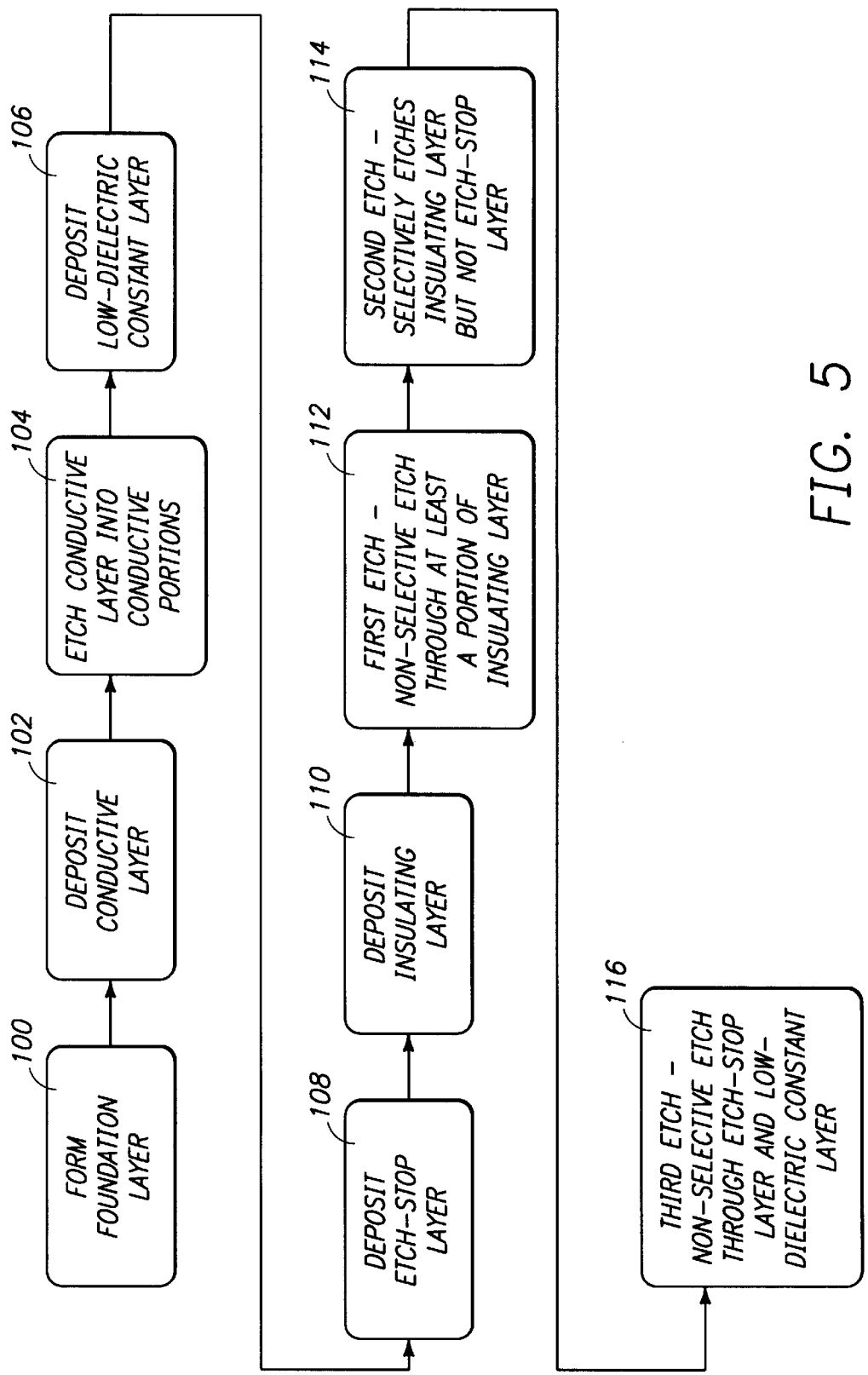
FIG. 5 shows a flow chart of an exemplary process of forming and etching vias in a semiconductor device.
Figure 6:
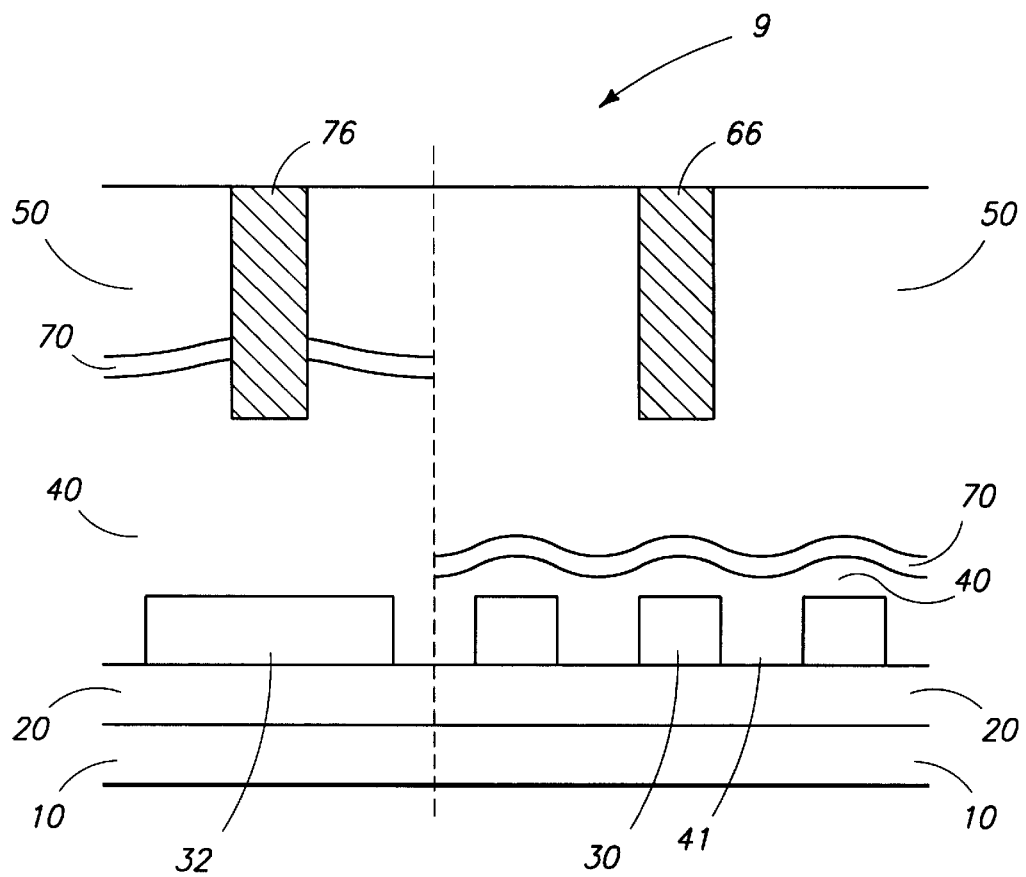
FIG. 6 shows a cross section of a portion of a semiconductor wafer having a first non-selective etch.

With reference to FIG. 5, an exemplary process flow chart sets forth suitable steps to form a semiconductor device (100, 102, 104, 106, 108, 110) having etch-stop layer 70, as discussed above, and suitable steps for etching a via (112, 114, 116) while minimizing the possibility of over-etch. More specifically, the multiple etch process includes a first etch 112, which preferably may be targeted to a depth approximately equal to or less than a minimum thickness of insulating layer 50. An average minimum thickness may be empirically determined and assumed for a given semiconductor device, the particular CMP process, and other manufacturing parameters. First etch 112 is preferably a non-selective etch, i.e., that the etchant used in creating first etch 112 equally etches any material to which it is exposed. First etch 112 is targeted such that no via over-etch will occur because first etch 112 will terminate before reaching etch-stop layer 70 above conductive lines 30 and, consequently, before low-k layer 40, as shown in FIG. 6. First etch 112 would penetrate etch-stop layer 70 when etched over conductive plate 32.

Figure 7:
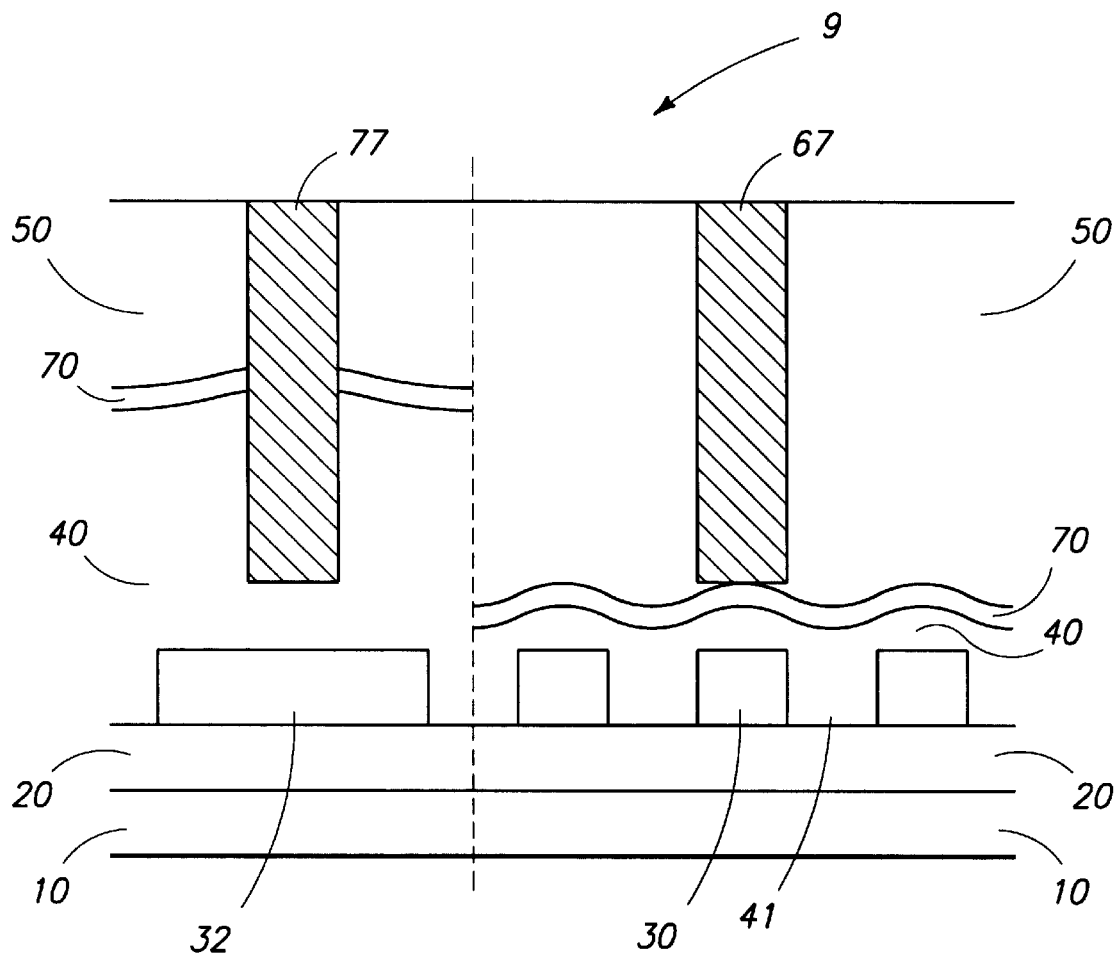
FIG. 7 shows a cross section of a portion of a semiconductor wafer having a second selective etch.

A second etch 114 is a selective etch which etches through insulating layer 50 and may be targeted to a depth that is greater than or equal to the difference between the minimum thickness of insulating layer 50 and a maximum thickness of insulating layer 50. The depth of the second etch depends on the depth selected for first etch 112. The combined depths of first etch 112 and second etch 114 is preferably greater than or equal to the maximum possible thickness of insulating layer 50. Second etch 114 is a selective etch in that insulating layer 50 exhibits high selectivity over etch-stop layer 70 in the presence of the etchant used to create second etch 114. Second etch 114 is preferably targeted to ensure that all of insulating layer 50 will be etched over conductive lines 30 as shown in FIG. 7. Second etch 114 will approximately reach conductive plate 32.

Figure 8:
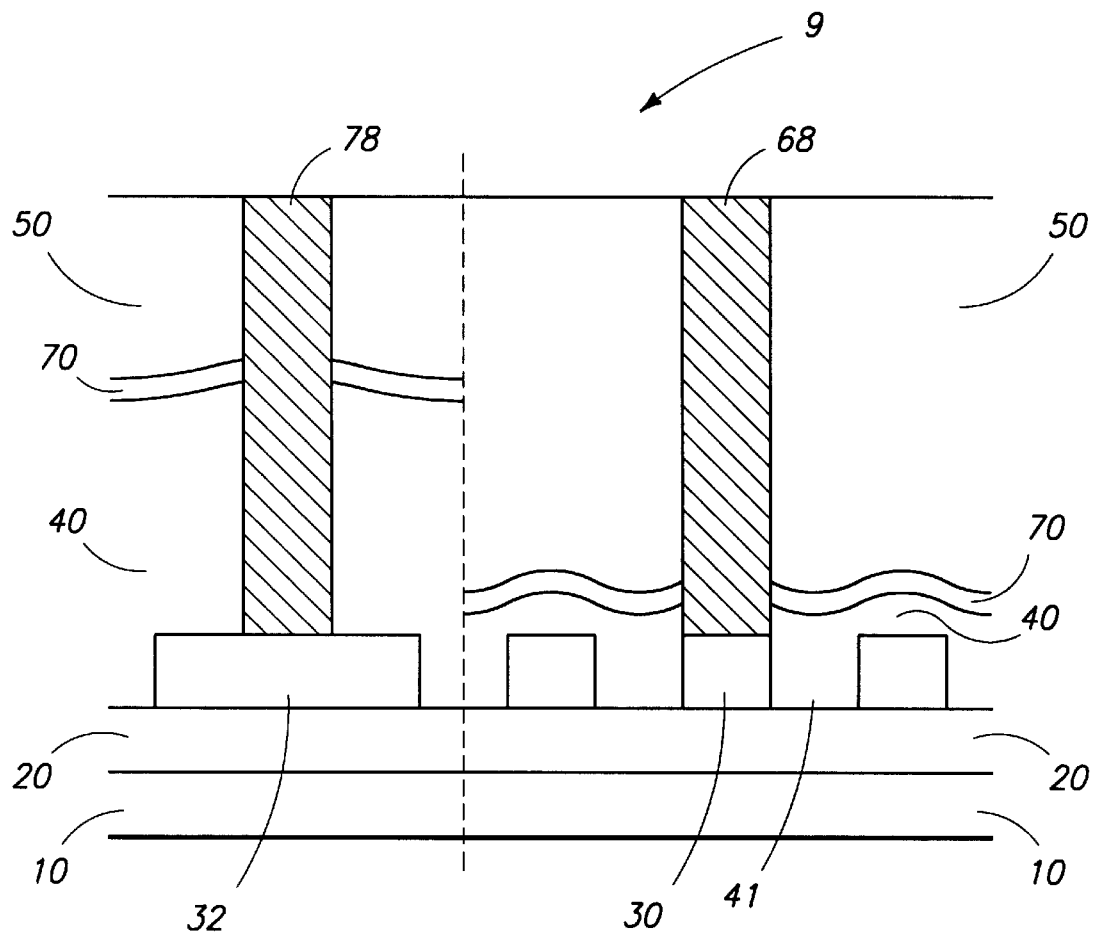
FIG. 8 shows a cross section of a portion of a semiconductor wafer having a third non-selective etch.

A third etch 116 in FIG. 5 may be targeted to a depth approximately equal to the thickness of etch-stop layer 70, and the thickness of low-k layer 40 above conductive layer 30. Third etch 116 is targeted to ensure that a via will be etched through to conductive layer 30 as shown in FIG. 8. Third etch 116 is preferably a non-selective etch, as described above. In the case of etches above conductive plate 32, third etch 116 ensures that conductive plate 32 is reached.

Describing the process of FIG. 5, FIGS. 6–8 show a via at each point during this multiple etch process. As one skilled in the art will recognize, although only one exemplary via is shown, this process may be used to create a plurality of vias. Specifically, with reference to FIG. 6, a first etch creates via 66 and via 76. Via 66 and via 76 penetrate insulating layer 50. Assume, for example, the combined thicknesses of insulating layer 50, etch-stop layer 70, and low-k layer 40 range from 750 nm to 1,250 nm above conductive layer 30. Assume further that the thickness of etch-stop layer 70 is 40 nm and the thickness of low-k layer 40 is 40 nm. The first etch could be, for example, 500 nm deep although other etch depths equal to or less than 670 mn could be chosen. Based on the exemplary thickness values, via 66, which terminates a few layers above conductive line 30, would only penetrate a portion of insulating layer 50. Via 76, which terminates a layer above conductive plate 32, penetrates insulating layer 50, etch-stop layer 70 and a portion of low-k layer 40. If the etching is performed by introducing gases into an enclosed chamber as is well known in the art, a gas such as carbon tetraflouride could be used to create via 66 and via 76. As one skilled in the art will appreciate, other gases and other methods are capable of etching insulating layer 50. The first etch can be referred to as a non-selective etch in that as long as insulating layer 50 is etched, it is irrelevant what other materials are or are not also etched.

With reference to FIG. 7, a second selective etch creates via 67 which is a few layers above conductive layer 30, by etching through insulating layer 50 but not through etch-stop layer 70. Given that the exemplary first etch was targeted for 500 mn, the second etch could be targeted for 670 nm to ensure that via 67 goes through to etch-stop layer 70. Implementing the second etch requires introducing a gas into an enclosed chamber, as is well known in the art, which gas does not etch through etch-stop layer 70. This second etch is selective in that it etches one layer, namely insulating layer 50, but not another layer, namely etch-stop layer 70. Put another way, insulating layer 50 exhibits a high etch selectivity over etch-stop layer 70 in the presence of the etchant creating the second etch. This second etch also creates via 77. Because via 76 already passed through etch-stop layer 70, the selectivity of this second etch in creating via 77 over conductive plate 32 is not as important for etching over conductive plates. However, typically wafers include a number of conductive lines as well as conductive plates.

With reference to FIG. 8, a third non-selective etch 116, similar to the first etch, is performed to create via 68 and via 78. The third etch is targeted to penetrate through etch-stop layer 70 and low-k layer 40 to reach conductive lines 30. Both etch-stop layer 70 and low-k layer 40 are capable of having substantially consistent thicknesses from wafer to wafer and within each wafer. If etching is performed by introducing gases into an enclosed chamber, via 68 and via 78 can be made by introducing the same gas that is introduced in the formation of via 66 and via 76. A conductive filler material (not shown) such as tungsten may be deposited into completed via 68 and via 78 to connect conductive lines 30 and conductive plate 32 with another conductive material (not shown) placed above insulating layer 50.

In an exemplary embodiment of the present invention if no wide conductive plates are present on the wafer, it may be possible to etch vias using only a two-step process. With reference to FIG. 5, steps 100, 102, 104, 106, 108 and 110, which set forth an exemplary process for forming a semiconductor device, would remain the same. First etch 112 which etches through at least a portion of insulating layer 50, may not be necessary. If first etch 112 is eliminated, the depth of a new first etch should be approximately equal to the maximum thickness of insulating layer 50. The new first etch preferably is a selective etch such as that of second etch 114. A new second etch could be a non-selective etch such as that of third etch 116. The depth of a new second etch, would remain the same as the depth of third etch 116.

In summary, the present invention reduces the formation of poisoned vias on semiconductor wafers which uses submicron process technology by the addition of an etch-stop layer above the low-k layer. The inclusion of this etch-stop layer and multi-step etch process in the formation of vias on semiconductor wafers may significantly increase the yield of semiconductor devices.

It will be understood that the foregoing description is of preferred exemplary embodiments of this invention and that this invention is not so limited. Various modifications may be made in the design, arrangement, and implementation of this method and apparatus without departing from the spirit and scope of the subject invention, as set forth in the claims below.

What is claimed is:

1. A method for forming vias in a semiconductor device, said semiconductor device having a foundation layer having at least one layer of material, a conductive layer formed above said foundation layer and etched into conductive portions, a low dielectric constant layer formed above said conductive layer, an etch-stop layer formed above said low dielectric constant layer, and an insulating layer formed above said etch-stop layer, said method comprising:

first etching a via into said insulating layer with a first non-selective etchant such that said via terminates within said insulating layer;

second etching said via into said insulating layer with a second selective etchant such that said via terminates proximate said etch-stop layer; and third etching said via with a third non-selective etchant through said etch-stop layer and said low dielectric constant layer such that said via terminates proximate said conductive layer.

2. The method of claim 1, wherein said etch-stop layer comprises silicon nitride.

3. The method of claim 1, wherein said via is etched by said first etchant to a depth that is equal to or less than a minimum thickness of said insulating layer.

4. The method of claim 1, wherein said insulating layer exhibits high etch selectivity in the presence of said first etchant.

5. The method of claim 1, wherein said insulating layer exhibits high etch selectivity over said etch-stop layer in the presence of said second etchant.

6. The method of claim 1, wherein said etch-stop layer and said low dielectric constant layer exhibit high etch selectively in the presence of said third etchant.

7. The method of claim 1, wherein said low dielectric constant layer comprises a material having a dielectric constant of less than 4.0.

8. The method of claim 7, wherein said low dielectric constant layer comprises hydrogen silsesquioxane.

9. The method of claim 1, further comprising obtaining the approximate average minimum thickness of said insulating layer, wherein upon said first etching said via terminates at a depth approximately equal to the average minimum thickness of said insulating layer.

* * * * *